United States Patent [19]
Peng

[11] Patent Number: 5,986,310
[45] Date of Patent: Nov. 16, 1999

[54] PROLONGING A POLYSILICON LAYER IN SMALLER MEMORY CELLS TO PREVENT POLYSILICON LOAD PUNCH THROUGH

[75] Inventor: Chun Hung Peng, Hsinchu, Taiwan

[73] Assignee: Winbond Electronics Corp., Hsinchu, Taiwan

[21] Appl. No.: 08/925,199

[22] Filed: Sep. 8, 1997

[51] Int. Cl.$^6$ .................................................. H01L 27/02
[52] U.S. Cl. .......................... 257/379; 257/380; 257/350; 257/533; 257/904
[58] Field of Search ..................... 257/903–904, 257/350–352, 379–380, 516, 533

[56] References Cited

U.S. PATENT DOCUMENTS

| | | | |
|---|---|---|---|
| 5,757,053 | 5/1998 | Liu | 257/379 |
| 5,872,381 | 2/1999 | Kato et al. | 257/380 |

Primary Examiner—Jey Tsai
Attorney, Agent, or Firm—Bo-In Lin

[57] ABSTRACT

This invention discloses a memory cell having a first polysilicon as a gate. The memory cell includes a three-layer structure covering the first polysilicon as gate with a plurality of via-1 openings exposing the first polysilicon as gate therein wherein the three-layer structure includes a first TEOS oxide layer covered by a silicon nitride layer which is covered by a second TEOS oxide layer. The second TEOS layer includes a resistor portion defined a plurality of trenches therein. The memory cell further includes a patterned second polysilicon layer covered the via-1 openings thus contacting the gate and a connector portion on the second TEOS layer to function as connector therefor. The second polysilicon layer further covering the resistor portion includes the plurality of trenches to function as a load resistor therein whereby the load resistor is prolonged by the trenches.

8 Claims, 5 Drawing Sheets

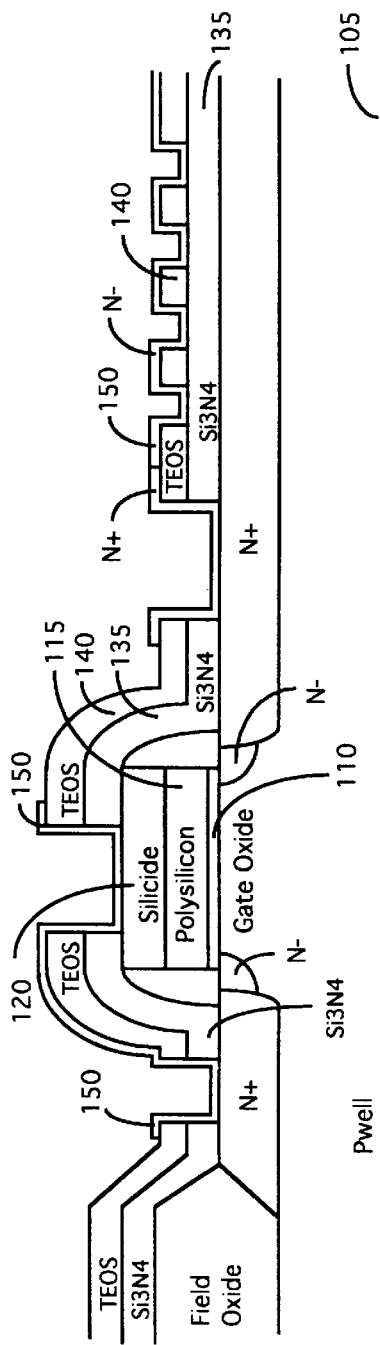
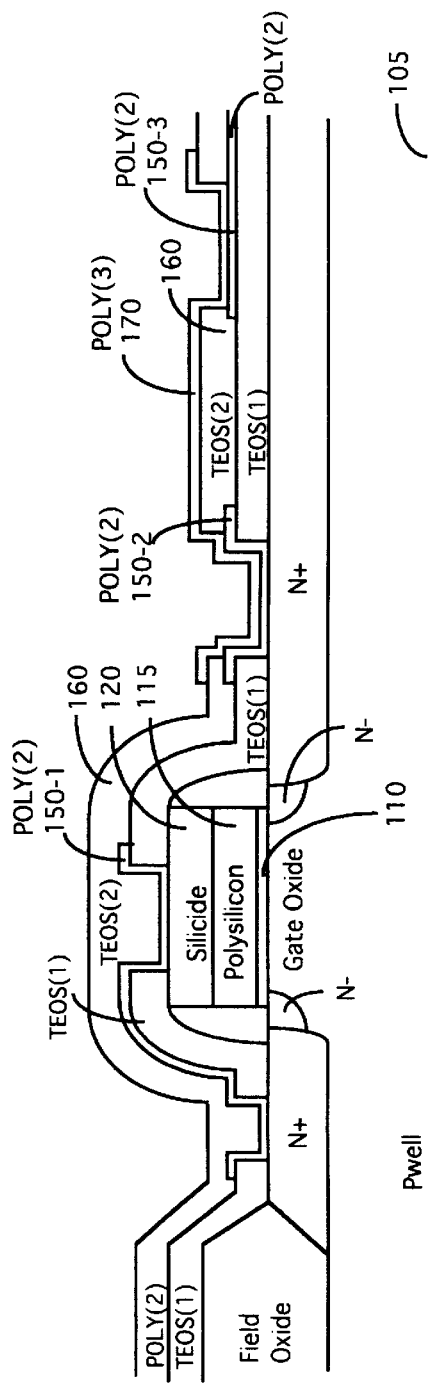
FIG. 2C
FIG. 2D

PROLONGING A POLYSILICON LAYER IN SMALLER MEMORY CELLS TO PREVENT POLYSILICON LOAD PUNCH THROUGH

BACKGROUND OF THE INVENTION

1. Field of the Invention

This invention relates generally to the cell structure and fabrication method of the memory cell and arrays. More particularly, this invention relates to a novel and improved cell structure and fabrication process including a novel prolonged polysilicon layer to increase the load resistance for a smaller memory cell whereby a polysilicon load punch through can be prevented.

2. Description of the Prior Art

A major difficulty faced by those who are attempting to reduce the size of a memory cells is a length requirement of a polycrystalline silicon layer employed as a load resistor for the memory cell. For example, the load resistors used in a memory cells as pull-up resistors must have high value of resistance to prevent a punch-through. As these resistors are formed as part of the polycrystalline layer wherein portions of the layer are employed as connector which are doped with higher concentration. Extra length of polysilicon layer becomes a design requirement due to the concern of lateral diffusion during the thermal cycles causing a reduction of resistance. The length requirement thus hinders the size of the cell to be further miniaturized and the problem with polysilicon load punch through becomes a design concern particularly with memory array of smaller cell size.

In order to better understand the background of the invention, a conventional method for implementing a load resistor on a polycrystalline layer is first described according to FIG. 1A to 1C. In FIG. 1A, a cross sectional view is illustrated wherein a sequence of standard memory cell manufacture processes are performed on a substrate to carry out the processing steps of isolation, well formation and $V_{th}$ dose implantation for adjusting the threshold voltage. A gate oxide layer is grown followed by depositing the first polycrystalline silicon layer and optionally a silicide deposition as shown in FIG. 1A. Referring to FIG. 1B, the gate region is patterned followed by a LDD and a source/drain (S/D) formation process. A TEOS oxide layer is then deposed on the top surface and the polysilicon via is formed.

Referring to FIG. 1C, a second polysilicon layer is formed followed by a blank implant with a low dose implanting ions to adjust the load resistance of the second polysilicon layer. The second polysilicon layer is then patterned wherein part of the second polysilicon layer, i.e., polysilicon (2), will be utilized as a connector and the remaining portion of that layer is applied as a load resistor. The portion utilized as a connector is more heavily doped. The sequence of implant the connector and the patterning of the second polysilicon layer can be exchanged. The processing steps and the resulting configuration generate a particular problem for the load resistor, i.e., the $N^-$ segment disposed between two more heavily doped $N^+$ segments. Namely, a lateral diffusion of the implanted ions in the more heavily $N^+$ segment will cause the implanted ions to diffuse into the load resistor segment which is more lightly doped $N^{31}$ segment. The resistance of the load resistor will be adversely reduced and a potential problem of punch through may be resulted from the load resistance reduction. In order to assure sufficient resistance is maintained after the thermal cycles, extra length of the polysilicon layer (2) is provided in anticipation of the reduction of the effective length caused by lateral diffusion during high temperature cycles in subsequent processing steps. Therefore, size reduction of a memory cell is limited by the length of the second polysilicon layer which is employed as load resistor. A minimum length is required for this second polysilicon layer in order to prevent the occurrence of a punch through which may be induced during the thermal cycles in the manufacturing process leading to the lateral diffusion and resistance reduction of the load resistor.

In U.S. Pat. NO. 5,172,211, entitled "High Resistance Polysilicon Load Resistor" (issued on Dec. 15, 1992), Godinho et al. disclose a load resistor used in a semiconductor integrated circuit which consists of two portions of conductive material, typically strips of either a silicide or a composite polycrystalline silicon layer and silicide layer formed thereon. The strips are formed on a semiconductor substrate and separated from each other by a selected distance. An electrically conductive dopant diffusion barrier is formed on the first and second portions of conductive material. A polycrystalline silicon layer is then placed on the structure such that one portion of the polycrystalline silicon material is in ohmic contact through the diffusion barrier with the first portion of conductive material and the other portion of the polycrystalline silicon material is in ohmic contact through the diffusion barrier with the second portion of the conductive material. The diffusion barrier layer serves to prevent any dopant from the conductive material from diffusing into the poly-crystalline silicon, i.e., polysilicon, material thereby allowing the polycrystalline silicon material to function as a load resistor having a high resistance.

The load resistor disclosed by Gadinho et al. provides a solution to maintain the resistance of the load resistor by forming dual separated polysilicon strips and implementing a diffusion barrier between these strips thus creating a high resistance load resistor which being affected by lateral diffusion of dopant into the resistor. However, Gadinho's device requires more complicate processing steps in forming two separate polysilicon strips and then a diffusion barrier between them. The production costs for implementing the structural features is increased due to the more complicate manufacturing processes. Product yield and reliability of the memory device may also be adversely affected when more complicate processing steps are performed.

Therefore, a need still exists in the art of memory cell design and manufacture to provide a novel cell structure and manufacture process to resolve the above difficulties. It is desirable that the novel memory cell architecture can significantly relieve the limitation that a smaller memory cell often encounter a punch through problem at the polysilicon load. By resolving this particular limitation would allow the cell size to be further reduced. Additionally, it is desirable that this novel cell structure and manufacture process would be simple and convenient to carry out such that the quality of the transistor array and production cost would not be adversely affected by a more complicate manufacture process.

SUMMARY OF THE PRESENT INVENTION

It is therefore an object of the present invention to provide a novel and improved manufacture process and cell structure for a memory cell where a polysilicon load resistor can be prolonged to maintain a high load resistance without requiring the increase of the memory cell size such that the aforementioned difficulties and limitations encountered in the prior art can be overcome.

Specifically, it is an object of the present invention to provide a novel and improved manufacture process and cell structure for a load resistor wherein a new layer structure is implemented by adding an oxide tunneling layer thus providing a load resistor therein such that a high resistance for the load resistor can be maintained without being affected by lateral diffusion during the thermal cycles in the manufacture process whereby extra-length of polysilicon layer provided to compensate the lateral diffusion effect is no longer necessary.

Another object of the present invention is to provide a novel and improved manufacture process and cell structure for a for a load resistor wherein a new layer structure is implemented by adding an oxide tunneling layer as the load resistor underneath the polysilicon connector such that an improved cell structure can be implemented to provide a load resistor with constant high resistance without requiring high precision manufacture processes for making a complicate structure whereby substantial increase in production time and cost can be avoided.

Another object of the present invention is to provide a novel and improved manufacture process and cell structure for a load resistor wherein a new layer structure is implemented by adding an oxide tunneling layer as the load resistor underneath the polysilicon connector such that the cell size can be further reduced without being limited by a longer polysilicon layer as required in the prior art device whereby memory array of higher cell density can be achieved.

Briefly, in a preferred embodiment, the present invention discloses a memory cell having a first polysilicon as a gate. The memory cell includes a three-layer structure covering the first polysilicon as gate with a plurality of via-1 openings exposing the first polysilicon as gate therein wherein the three-layer structure includes a first TEOS oxide layer covered by a silicon nitride layer which is covered by a second TEOS oxide layer. The second TEOS layer includes a resistor portion defined a plurality of trenches therein. The memory cell further includes a patterned second polysilicon layer covered the via-1 openings thus contacting the gate and a connector portion on the second TEOS layer to function as connector therefor. The second polysilicon layer further covering the resistor portion includes the plurality of trenches to function as a load resistor therein whereby the load resistor is prolonged by the trenches.

In an alternate preferred embodiment, the present invention discloses a memory cell which has a first polysilicon as a gate. The memory cell includes a first TEOS oxide layer covering the first polysilicon as gate with a plurality of via-1 openings exposing the first polysilicon as gate therein. The memory cell further includes a patterned second ploysilicon covering a portion of the first TEOS oxide layer and the via-1 openings thus contacting the gate to function as connector therefor. The memory cell further includes a second TEOS oxide layer overlying the connector defining a plurality of via-2 opening exposing the connector therein the second TEOS oxide layer further defining a raised oxide terrace. The memory cell further includes a patterned third polysilicon layer covering the plurality of via-2 openings thus contacting the connector therein and the patterned third polysilicon layer further covering the raised oxide terrace thus constituting a prolonged load resistor therein for the memory cell.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 2A to 2D a series of cross sectional views for illustrating the processing steps applied to manufacture a memory device of the present invention with an tunneling oxide layer implemented as the load resistor.

DETAILED DESCRIPTION OF THE PREFERRED EMBODIMENT

Figure 1A:
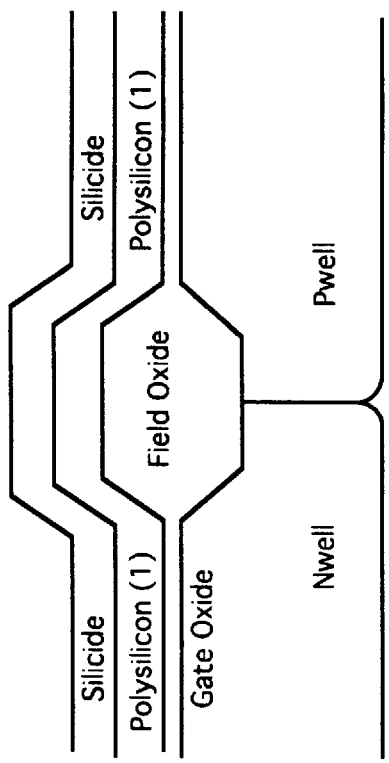
FIGS. 1A to 1C are a series of cross sectional views for illustrating the processing steps applied to manufacture a prior art memory device with the load resistor implemented as a part of a polysilicon connector.
Figure 1B:
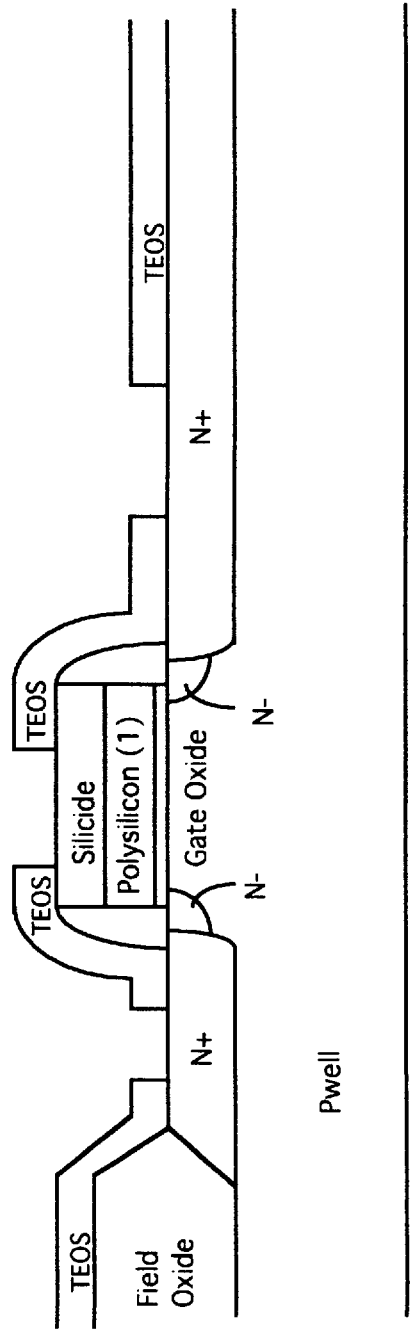
Figure 1C:
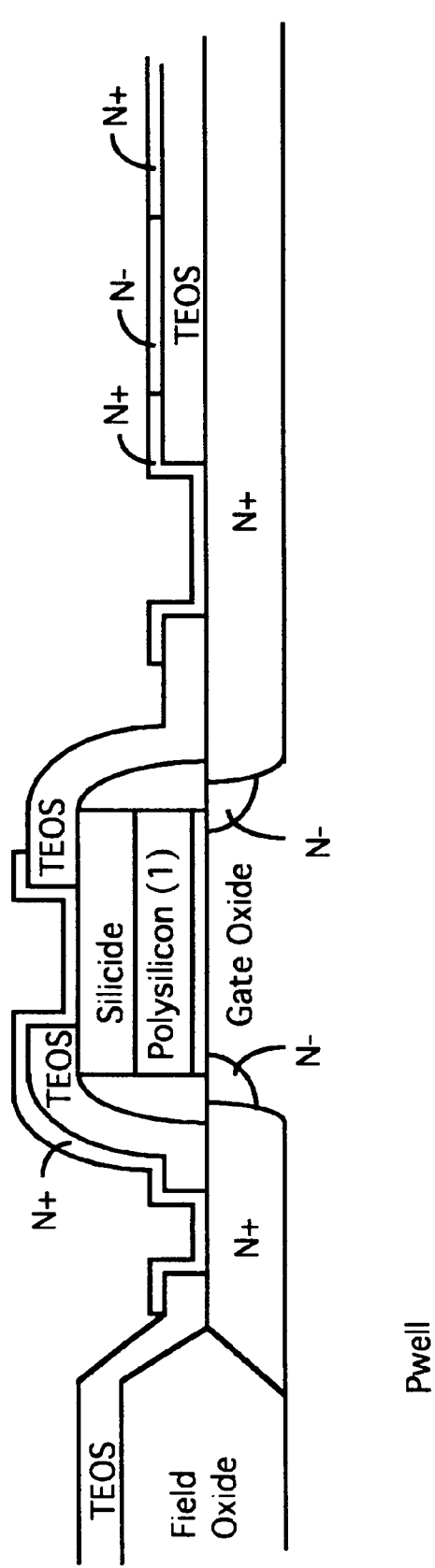
Figure 2A:
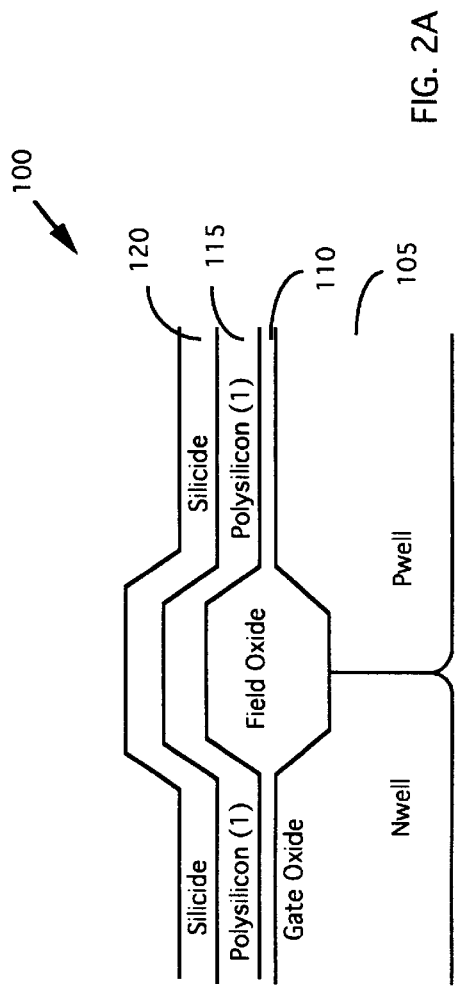

Referring to FIGS. 2A to 2D for a sequence of cross sectional views for illustrating the processing steps of a memory cell 100 of the present invention. FIGS. 2A is cross sectional view similar to FIG. 1A employed for manufacturing the prior art cells. In FIG. 2A, a cross sectional view is shown wherein a sequence of standard memory cell manufacture processes are performed on a substrate 105 to carry out the processing steps of isolation, well formation and $V_{th}$ dose implantation for adjusting the threshold voltage. A gate oxide layer is grown followed by depositing the first polycrystalline silicon layer 115 and optionally a silicide deposition to form the silicide layer 120 as shown in FIG. 2A.

Figure 2B:
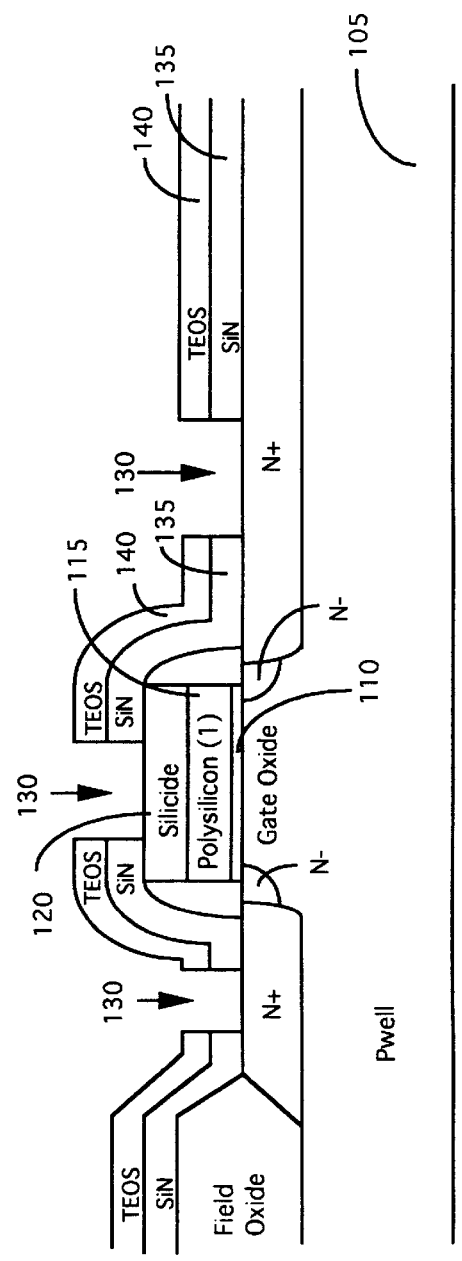

Referring to FIG. 2B, before the TEOS oxide layer is deposited, a thin silicon nitride layer 135 of 500–1000 Angstroms in thickness is formed. A TEOS oxide layer 140 is then deposited. A very thin TEOS can be deposited before the silicon nitride deposition to release the stress as the silicon nitride is in direct contact with the silicon substrate. For the purpose of brevity and clarity of illustration, this thin TEOS oxide layer is not shown. The polysilicon vias 130 are then opened by machining process applying a TEL DRM50 machine.

Referring to FIG. 2C, a specially configured mask is applied to pattern the TEOS oxide layer 140 wherein "mountains" and "valleys" are formed on the TEOS layer where the load resistor is to be formed on a second polysilicon layer. A second polysilicon layer 150 is then deposited and patterned as that shown in FIG. 2C. Because the special mountains and valleys profile in the TEOS oxide layer, the polysilicon-2 layer 150 is now formed with extra length longer than a layer formed on a regular flat surface. The extras length of this second polysilicon layer is generated without requiring to lengthen the dimension of a cell. For a smaller cell, the extra length gained by this special configuration for the load resistor serves to prevent a punch through due to shorter polysilicon load layer when the layer is formed on a regular flat surface according to the conventional technique. The device is further processed with TEOS oxide deposition and BPSG insulation layer formation followed by contact opening and metal line formation, and finally passivation layer formation. These steps are standard integrated circuit (IC) manufacture processes which are not described here in details for the sake of brevity and clarity.

A method is disclosed in this invention for manufacturing a connector and a load resistor for a memory cell which has a first polysilicon layer 115 as the gate for the memory cell 100. The method includes the steps of (a) forming a silicon nitride 135 overlying the first polysilicon layer 115 followed by depositing a first TEOS oxide layer 140 overlying the silicon nitride 135 thereunder; (b) etching a plurality of via-1 130 openings through the first TEOS oxide layer 140 and the silicon nitride layer 135 for exposing the first polysilicon 115 therein; (c) applying a specially configured load-resistor mask for etching a plurality of trenches in the first TEOS oxide layer 140; (d) removing the load-resistor mask and depositing a second polysilicon layer 150 over the via-openings 130 and the first TEOS oxide layer 140 including the trenches wherein a first portion of the second polysilicon layer 150 near the trenches being employed as the load resistor; (e) patterning and implanting a second portion of the second polysilicon layer 150 as the second connector for the memory cell; and (f) forming a second TEOS oxide layer 165 and a BPSG insulation layer 175 overlying the connector followed by contact opening and metal line formation processes to complete manufacturing the memory cell. In one of the preferred embodiments the step of applying a specially configured load-resistor mask for etching a plurality of trenches in the first TEOS oxide layer 140 is a step of etching the trenches with a depth ranging from 200 to 800 Angstroms in the first TEOS oxide layer. In yet another preferred embodiment, the memory cell is manufactured with a cell size ranging from 0.2 to 1.0 micrometer and the connector is patterned to have a length ranging from 0.2 to 0.8 micrometer and the load resistor is formed to have a length ranging from 0.2 to 0.8 micrometer with a proportionally increased with additional length of said load resistor covering said trenches.

In summary, this invention discloses a method for manufacturing a connector and a load resistor for a memory cell which includes a first polysilicon as gate 115. The method includes the steps of (a) forming a silicon nitride layer 135 as an etch stop layer overlying the first polysilicon layer 115 and a first TEOS oxide layer 140 thereon followed by etching a plurality of via-1 openings 130 for exposing the first polysilicon 115 therein; (b) etching a plurality of trenches in a resistor portion of the first TEOS oxide layer 140; and (c) forming a second polysilicon layer 150 having a resistor portion and a connector portion with the resistor portion covering the trenches to form the resistor thereon and the connector portion for performing a connector implant and patterning therein to form the connector.

Referring to FIG. 2D for an alternate embodiment of the present invention. After the patterning of the second polysilicon layer 150 to form the connector, e.g. 150-1, 150-2, and 150-3, a second TEOS oxide layer 160 is formed on top of the second polysilicon layer 150. A second polysilicon via is opened. Then a third polysilicon layer 170 is deposited on top of the second polysilicon layer 150-2 and 150-3 and the second TEOS layer 160 The third polysilicon layer is formed as the load resistor which has extra length as it surrounds the block formed by the second TEOS 160 on top of the second polysilicon layer 150-2 and 150-3. The third polysilicon layer 170 is lightly doped to produce a polysilicon layer with larger resistance to function as a load resistor for the device 100. As the third polysilicon layer 170 is formed with prolonged length, it would provide sufficient resistance even for smaller cells. The difficulties of punch through which may occur for smaller cells due to shorter load resistor and insufficient resistance are therefore resolved by this preferred embodiment Again, the device is further processed with TEOS oxide deposition and BPSG insulation layer formation followed by contact opening and metal line formation, and finally passivation layer formation. As these steps are standard integrated circuit (IC) manufacture processes, no further descriptions of the details are necessary for the disclosure of this invention.

Therefore, this invention discloses a method for manufacturing a connector and a load resistor for a memory cell which has a first polysilicon 115 as gate. The method includes the steps of (a) forming a first TEOS oxide layer 140 overlying the first polysilicon and etching a plurality of via-1 openings 130 for exposing the first polysilicon 115 therein; (b) forming a second polysilicon layer 150 overlying the first TEOS oxide layer and the via-1 openings for contacting the gate followed by a connector implant and patterning the second polysilicon layer 150 to form the connector for the memory cell; (c) depositing a second TEOS oxide layer 160 forming an oxide terrace overlying the connector followed by opening a load resistor window in the second TEOS oxide layer exposing the connector 150 therein; (d) forming a third polysilicon layer 170 contacting the connector 150 via the load resistor window followed by load resistor implant and patterning to form the load resistor; and (e) forming a third TEOS oxide layer 165 and a BPSG insulation layer 175 overlying the connector followed by contact opening and metal line formation processes to complete manufacturing the memory cell. In a preferred embodiment, the step of depositing a second TEOS oxide layer 160 with an oxide terrace overlying the connector 150 is a step of forming the second TEOS oxide layer with the oxide terrace having a thickness ranging from 200 to 800 Angstroms. In another preferred embodiment, the memory cell is manufactured with a cell size ranging from 0.2 to 1.0 micrometer and the connector is patterned to have a length ranging from 0.2 to 0.8 micrometer and the load resistor is formed to have a length ranging from 0.2 to 0.8 micrometer with a resistance proportionally increased with additional length of said load resistor covering said raised oxide terrace.

In summary, this invention discloses a method for manufacturing a connector and a load resistor for a memory cell which has a first polysilicon 115 as the gate. The method includes the steps of (a) forming a first TEOS oxide layer 140 overlying said first polysilicon layer 115 and etching a plurality of via-1 openings 130 for exposing said first polysilicon 115 therein followed by forming a second polysilicon layer 150 thereon then performing connector implant and patterning to form said connector therein; and (b) depositing a second TEOS oxide layer 160 over said connector forming an oxide terrace thereon followed by etching a load resistor 170 therein then depositing a third polysilicon 160 thereon followed by load resistor implant and patterning to from said resistor therein.

Figure 3:
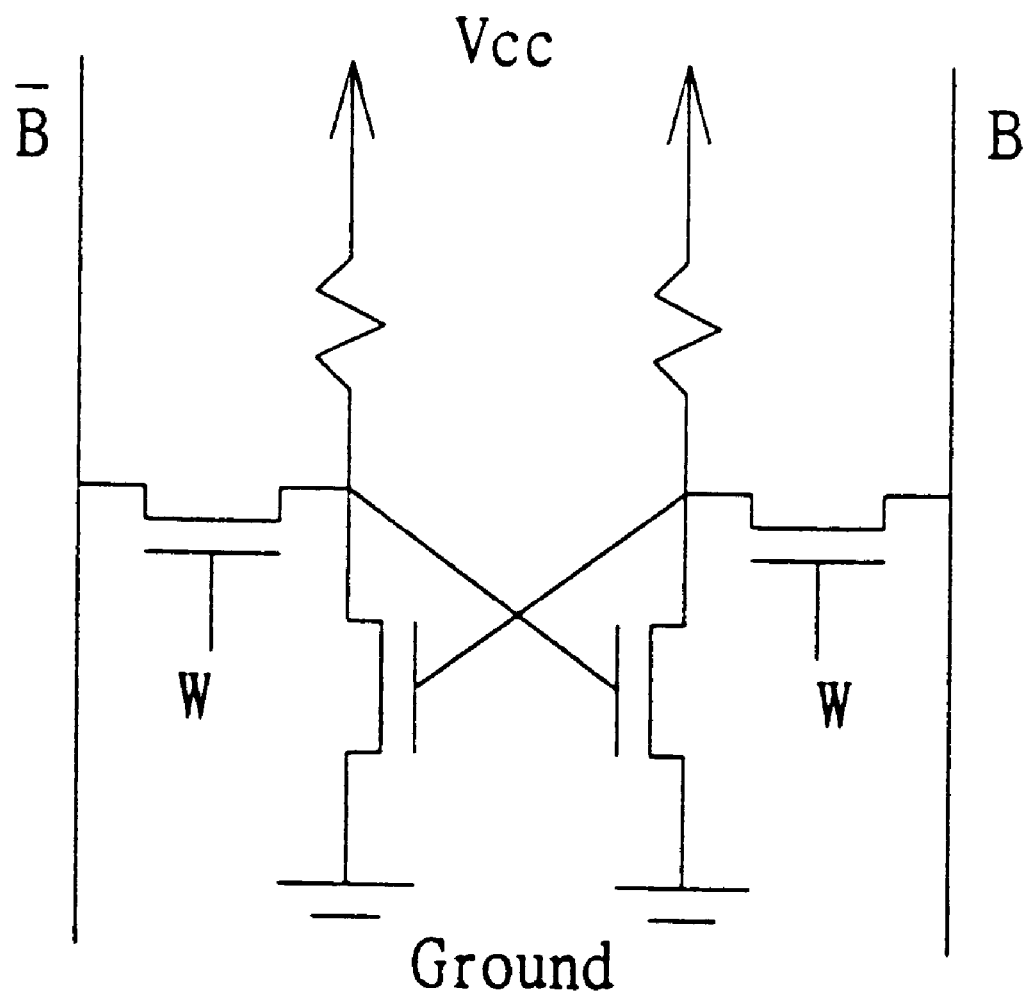
FIGS. 3 is a circuit diagram showing the equivalent circuit of the memory cell implemented with the novel cell structure provided with an improved load resistor.

An equivalent circuit diagram is shown in FIG. 3 when M1 MOS is in ON state, and M2 is in OFF state. Most of the voltage drop of Vcc is on the T1 load. Under this condition, the polysilicon load resistor of extra length still functions properly and no breakdown phenomenon is experienced in actual operational condition. By providing a reliable load resistor with high resistance implemented with the tunneling oxide 140, the length of the second polysilicon layer 150 can be reduce. The cell size can be miniaturized without be limited by a certain length requirement of the second polysilicon layer as that encountered in a prior art configuration.

Therefore, the present invention provides a novel and improved manufacture process and cell structure for a memory cell where a high load resistance provided by a load resistor. The high load resistance can be maintained without requiring a longer polysilicon length whereby the difficulties and limitations encountered in the prior art are overcome. Specifically, the present invention provides a novel and improved manufacture process and cell structure for a load resistor wherein a new layer structure is implemented by adding an oxide tunneling layer thus providing a load resistor therein. A high resistance for the load resistor is maintained without being affected by lateral diffusion during the thermal cycles in the manufacture process, therefore, extra-length of polysilicon layer provided to compensate the lateral diffusion effect is no longer necessary. Furthermore, the oxide tunneling layer as the load resistor underneath the polysilicon connector can be implemented without requiring high precision manufacture processes for making a complicate structure and substantial increase in production time and cost can be avoided. Thus, by employing the novel and improved manufacture process and the cell structure for a load resistor, the cell size can be further reduced without being limited by a longer polysilicon layer as required in the prior art device whereby memory array of higher cell density can be achieved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A memory cell having a first polysilicon as a gate comprising:

a three-layer structure covering said first polysilicon as gate with a plurality of via-1 openings exposing said first polysilicon as gate therein wherein said three-layer structure includes a first TEOS oxide layer covered by a silicon nitride layer which is covered by a second TEOS oxide layer;

said second TEOS layer includes a resistor portion defined a plurality of trenches therein;

a patterned second polysilicon layer covered said via-1 openings thus contacting said gate and a connector portion on said second TEOS layer to function as connector therefor; and said second polysilicon layer further covering said resistor portion includes said plurality of trenches to function as a load resistor therein whereby said load resistor is prolonged by said trenches.

2. The memory cell of claim 1 wherein:

said trenches defined in said second TEOS oxide layer having a depth ranging from 200 to 800 Angstroms whereby said load resistor disposed thereon is prolonged by a distance ranging from 0.2 to 0.8 micrometers.

3. The memory cell of claim 2 wherein:

said memory cell having a cell size ranging from 0.2 to 1.0 micrometer and said connector having a length ranging from 0.2 to 0.8 micrometer and said load resistor having a length ranging from 0.2 to 0.8 micrometer with a resistance proportionally increased with additional length of said load resistor covering said trenches.

4. A memory cell having a first polysilicon as a gate comprising:

a first TEOS oxide layer covering said first polysilicon as gate with a plurality of via-1 openings exposing said first polysilicon as gate therein;

a patterned second ploysilicon covering a portion of said first TEOS oxide layer and said via-1 openings thus contacting said gate to function as connector therefor;

a second TEOS oxide layer overlying said connector defining a plurality of via-2 opening exposing said connector therein said second TEOS oxide layer further defining a raised oxide terrace;

a patterned third polysilicon layer covering said plurality of via-2 openings thus contacting said connector therein and said patterned third polysilicon layer further covering said raised oxide terrace thus constituting a prolonged load resistor therein for said memory cell.

5. The memory cell of claim 4 wherein:

said raise oxide terrace defined by said second TEOS oxide layer having a height ranging from 200 to 800 Angstroms whereby said load resistor disposed thereon is prolonged by a distance ranging from 0.2 to 0.8 micrometers.

6. The memory cell of claim 5 wherein:

said memory cell having a cell size ranging from 0.2 to 1.0 micrometer and said connector having a length ranging from 0.2 to 0.8 micrometer and said load resistor having a length ranging from 0.2 to 0.8 micrometer with a resistance proportionally increased with additional length of said load resistor covering said raised oxide terrace.

7. A memory cell comprising:

a first polysilicon layer defining a gate for said memory cell;

an oxide layer covering said gate defined a plurality of via openings exposing said gate therein;

a patterned second polysilicon layer covering said via openings thus contacting said gate and providing a connector for said memory cell;

a second oxide layer covering said connector defining a plurality of via-2 openings exposing said connector therein, said oxide layer further includes an oxide terrace thereon; and a patterned third polysilicon layer covering said via-2 openings thus contacting said connector therein and said patterned third polysilicon layer further covering said oxide terrace to function as a prolonged load resistor for said memory cell therein.

8. The memory cell of claim 7 wherein:

said oxide terrace in said second oxide layer having a height ranging from 200 to 800 Angstroms whereby said load resistor formed thereon being prolonged a distance ranging from 400 to 1600 Angstroms in each of said load resistor trenches.

* * * * *